(12) United States Patent
Chen et al.

(10) Patent No.: US 7,768,059 B2
(45) Date of Patent: Aug. 3, 2010

(54) NONVOLATILE SINGLE-POLY MEMORY DEVICE

(75) Inventors: Hsin-Ming Chen, Tainan Hsien (TW); Shih-Chen Wang, Taipei (TW); Ming-Chou Ho, Hsin-Chu (TW); Shih-Jye Shen, Hsin-Chu (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 227 days.

(21) Appl. No.: 11/690,861

(22) Filed: Mar. 26, 2007

(65) Prior Publication Data

US 2007/0296018 A1 Dec. 27, 2007

Related U.S. Application Data

(60) Provisional application No. 60/805,751, filed on Jun. 26, 2006.

(51) Int. Cl.
*H01L 29/788* (2006.01)
(52) U.S. Cl. .................. 257/315; 257/239; 257/314; 257/E29.129; 365/228; 365/185
(58) Field of Classification Search .................. 257/315
See application file for complete search history.

(56) References Cited

U.S. PATENT DOCUMENTS

| 5,301,150 | A | * | 4/1994 | Sullivan et al. | 365/185.08 |
|---|---|---|---|---|---|
| 5,786,617 | A | | 7/1998 | Merrill | |
| 6,678,190 | B2 | | 1/2004 | Yang | |
| 6,704,222 | B2 | * | 3/2004 | Guterman et al. | 365/185.03 |
| 2004/0246243 | A1 | * | 12/2004 | Murade | 345/204 |
| 2005/0030826 | A1 | | 2/2005 | Diorio | |
| 2005/0030827 | A1 | | 2/2005 | Gilliland | |
| 2005/0121710 | A1 | * | 6/2005 | Shino | 257/296 |
| 2006/0018161 | A1 | * | 1/2006 | Chen et al. | 365/185.28 |

FOREIGN PATENT DOCUMENTS

| TW | 200512813 | 4/2005 |
|---|---|---|
| TW | 1246189 | 12/2005 |

* cited by examiner

*Primary Examiner*—Jerome Jackson, Jr.
*Assistant Examiner*—Dale Page
(74) *Attorney, Agent, or Firm*—Winston Hsu (57) ABSTRACT

A non-volatile single-poly memory device is disclosed. The non-volatile single-poly memory device includes two mirror symmetric unit cells, which is capable of providing improved data correctness. Further, the non-volatile single-poly memory device is operated at low voltages and is fully compatible with logic processes.

7 Claims, 6 Drawing Sheets

NONVOLATILE SINGLE-POLY MEMORY DEVICE

CROSS REFERENCE TO RELATED APPLICATIONS

This application claims the benefit of U.S. provisional application No. 60/805,751 filed Jun. 26, 2006.

BACKGROUND OF THE INVENTION

1. Field of the Invention

The present invention relates to a memory device, and more particularly to a non-volatile single-poly memory device, which is capable of providing improved data correctness. The present invention non-volatile single-poly memory device is operated at low voltages and is fully compatible with logic processes.

2. Description of the Prior Art

Non-volatile memory is one of the major data storage devices today. The most important feature is that non-volatile memory can retain the stored information even when not powered. Generally speaking, memory devices such as hard drives, erasable programmable read-only memory (EPROM), electrically erasable programmable read-only memory (EEPROM) and flash memory are non-volatile memory devices, because all information is still available in the absence of power supply.

As the demand for small size portable electrical devices such as personal digital assistants or cellular phones increases, there is a great need of the embedded chips for logic circuits and system on a chip. A flash memory, which is process compatible with CMOS logic processes and has low power consumption, high writing efficiency, low cost and high packing density, will meet the market demands.

Figure 1:
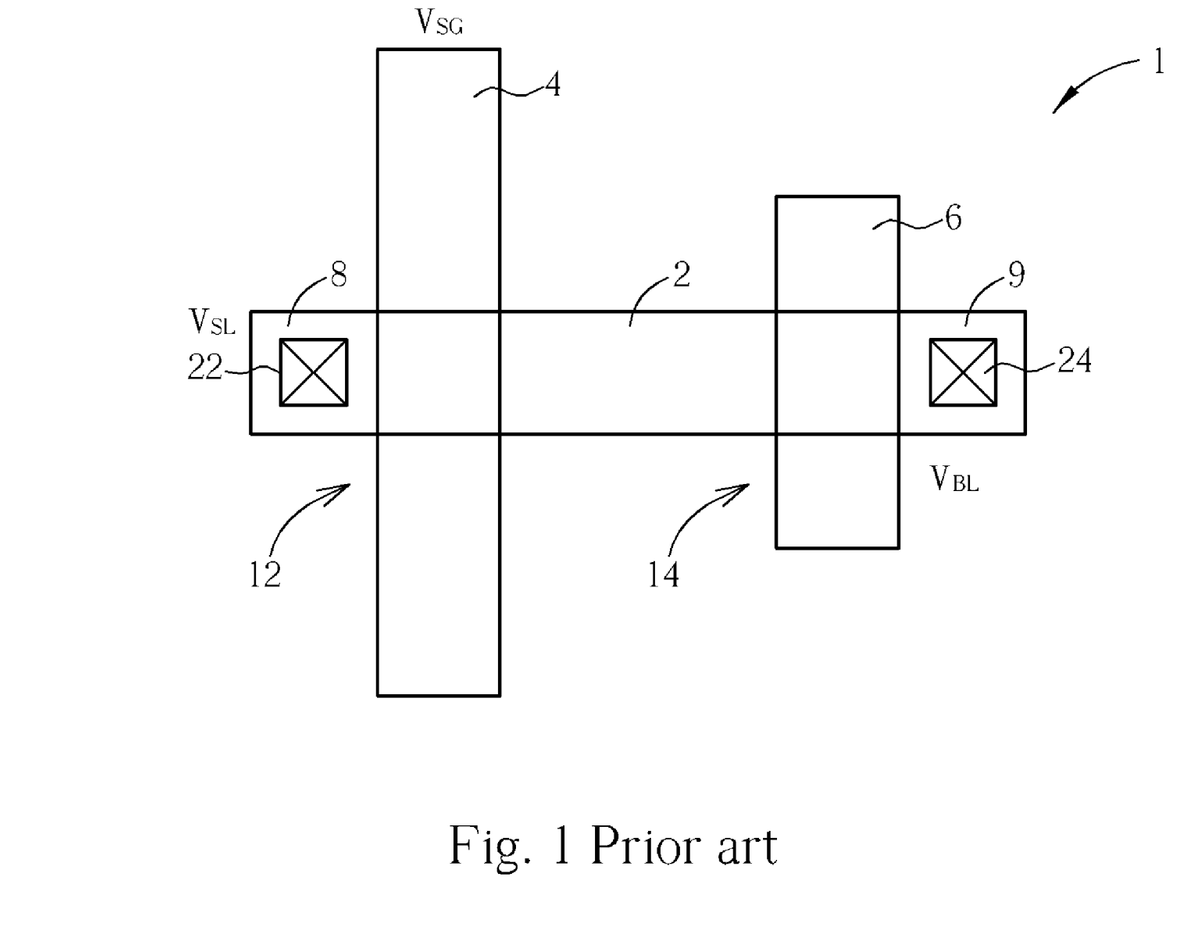
FIG. 1 is a schematic layout of a non-volatile memory cell according to prior art.

FIG. 1 is a schematic layout of a non-volatile memory cell according to U.S. Pat. No. 6,678,190. As shown in FIG. 1, memory cell 1 includes two serially connected PMOS transistors 12 and 14, wherein the PMOS transistor 12 includes a select gate 4, a $P^+$ drain/source doped region 8, and a $P^+$ drain/source doped region 2, and the PMOS transistor 14 includes a floating gate 6, a $P^+$ drain/source doped region 9, and the $P^+$ drain/source doped region 2. The PMOS transistors 12 and 14 share the $P^+$ drain/source doped region 2 mutually.

During operation, the select gate 4 of the PMOS transistor 12 is coupled to a select gate voltage $V_{SG}$, the $P^+$ drain/source doped region 8 of the PMOS transistor 12 is coupled to a source line voltage $V_{SL}$ through a contact plug 22, the $P^+$ drain/source doped region 2 and the floating gate 6 are floating. The $P^+$ drain/source doped region 9 of the PMOS transistor 14 is coupled to a bit line voltage $V_{BL}$ through a contact plug 24. During writing operation, electrons are selectively injected and stored in the floating gate 6.

The advantage of the abovementioned memory structure is that it can be operated under low voltages, and both of the PMOS transistors 12 and 14 are composed of a single layer of polysilicon such that they are fully compatible with logic processes.

However, in some situations where higher data correctness is required, for example, no data error is permitted so that the aforesaid memory cell may not be able to achieve customer's strict requirements. In other cases, when the flexibility of semiconductor processes is not adequate which might affect the charge retention ability of the non-volatile memory device, a few bits within the memory array may have charge retention problem, so new ideas are needed to improve the process flexibility.

Therefore, there is a strong need in this industry to provide a non-volatile single-poly memory device, which is capable of improving data correctness and operating at low voltages, and is fully compatible with logic processes.

SUMMARY OF THE INVENTION

It is therefore a primary object of the present invention to provide an improved non-volatile single-poly memory device, which is capable of providing higher data correctness, operating at low voltages and is fully compatible with logic processes.

According to one preferred embodiment of the present invention, a non-volatile single-poly memory device comprises a first unit cell comprising a select gate, a first $P^+$ source doped region and a first $P^+$ drain/source doped region, wherein the select gate, the first $P^+$ source doped region and the first $P^+$ drain/source doped region constitute a first select transistor; the first unit cell further comprises: a first floating gate transistor series connecting with the first select transistor, and the first floating gate transistor comprises a first floating gate, the first $P^+$ drain/source doped region and a first $P^+$ drain doped region, wherein the first select transistor uses the first $P^+$ drain/source doped region mutually with the first floating gate transistor; and a second unit cell comprising a second select transistor consisting of the select gate extending from the first unit cell, a second $P^+$ source doped region and a second $P^+$ drain/source doped region; the second unit cell further comprising a second floating gate transistor series connecting with the second select transistor, and the second floating gate transistor comprising a second floating gate, the second $P^+$ drain/source doped region and a second $P^+$ drain doped region, wherein the second select transistor uses the second $P^+$ drain/source doped region mutually with the second floating gate transistor.

These and other objectives of the present invention will no doubt become obvious to those of ordinary skill in the art after reading the following detailed description of the preferred embodiment that is illustrated in the various figures and drawings.

DETAILED DESCRIPTION

The present invention pertains to a novel non-volatile memory device, which is capable of providing higher data correctness, operating at low voltages and is fully compatible with logic processes.

Figure 2:
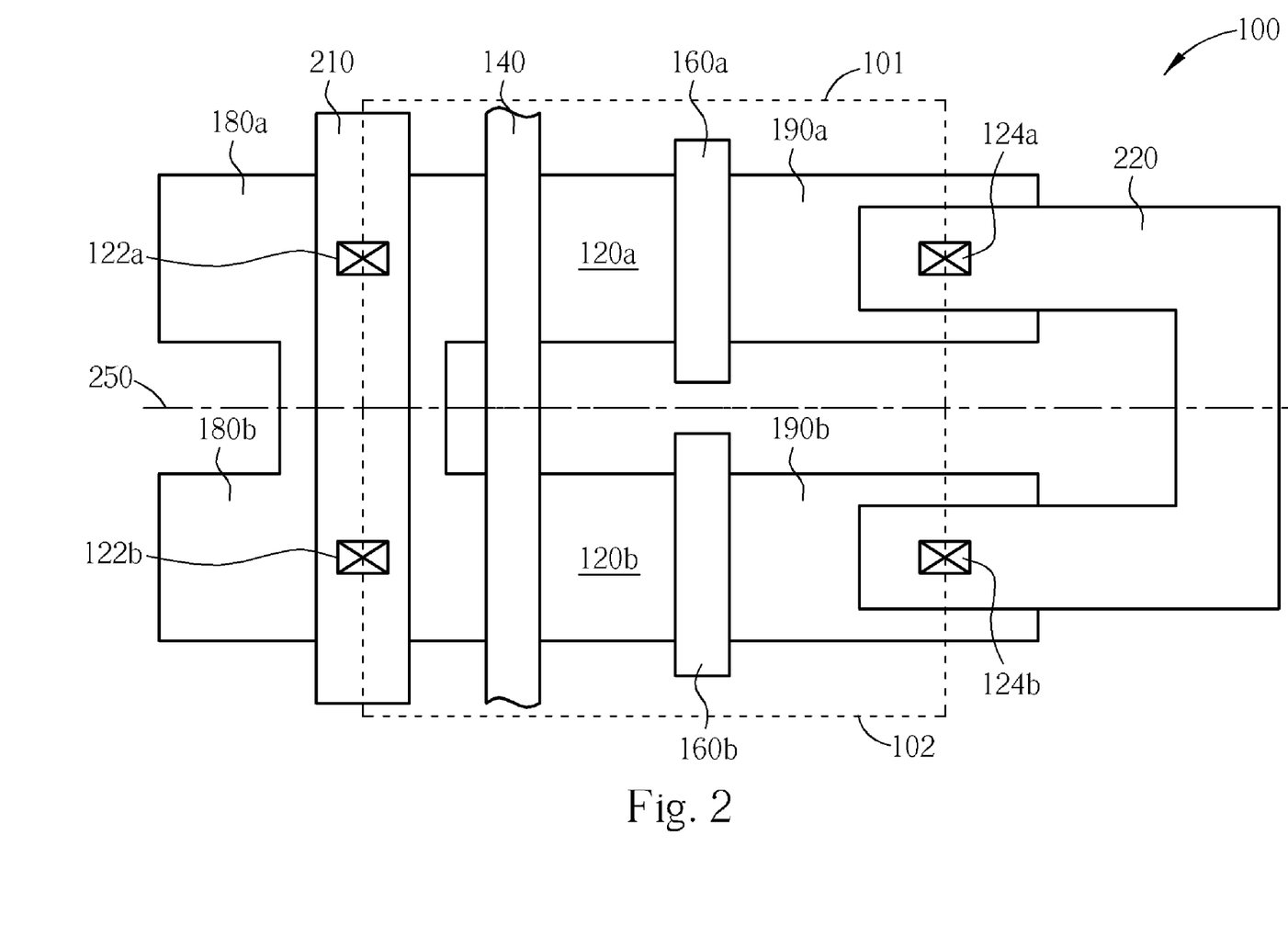
FIG. 2 is a schematic layout of a non-volatile memory cell according to the first preferred embodiment of the present invention.

FIG. 2 is a schematic layout of a non-volatile memory cell device 100 according to the first preferred embodiment of the present invention. As shown in FIG. 2, the non-volatile memory device 100 comprises two unit cells 101 and 102, wherein the unit cells 101 and 102 are symmetric mirror images to each other in relative to the symmetric line 250.

The unit cell 101 comprises a P+ source doped region 180a, a P+ drain/source doped region 120a and a select gate 140 that is mutually used by the unit cell 102. The select gate 140, the P+ source doped region 180a and the P+ drain/source doped region 120a constitute a first select transistor of the non-volatile memory device 100. The unit cell 101 further comprises a first floating gate transistor serially connecting with the first select transistor. The first floating gate transistor comprises a floating gate 160a, the P+ drain/source doped region 120a and a P+ drain doped region 190a, wherein the first select transistor uses the P+ drain/source doped region 120a mutually with the first floating gate transistor.

The unit cell 102 comprises a select gate 140 extending from the unit cell 101, a P+ source doped region 180b and a P+ drain/source doped region 120b. The select gate 140 extending from the unit cell 101, the P+ source doped region 180b and the P+ drain/source doped region 120b constitute a second select transistor of the non-volatile memory device 100. The unit cell 102 further comprises a second floating gate transistor serially connecting with the second select transistor. The second floating gate transistor comprises a floating gate 160b, the P+ drain/source doped region 120b and a P+ drain doped region 190b, wherein the first select transistor uses the P+ drain/source doped region 120b mutually with the second floating gate transistor.

According to the first preferred embodiment of the present invention, the P+ source doped regions 180a and 180b of the non-volatile memory device 100 are connected to the same source line 210 through contact plugs 122a and 122b respectively. The source line 210 provides a source line voltage $V_{SL}$. The P+ drain doped regions 190a and 190b of the non-volatile memory device 100 are connected to the same bit line 220 through contact plug 124a and 124b respectively. The bit line 220 provides a bit line voltage $V_{BL}$. The P+ drain/source doped region 120a, the P+ drain/source doped region 120b, and the floating gates 160a and 160b are floating. The select gate 140 and the floating gate 160a and 160b are composed of a single layer of polysilicon.

The features of the non-volatile memory device 100 depicted in FIG. 2 include that the unit cells 101 and 102 are symmetric mirror images to each other in structure and are used for one-bit storage, which is also referred as dual-cell per bit type non-volatile memory device. The unit cell 101 and the unit cell 102 mutually use the same select gate 140. Besides, the unit cells 101 and 102 are connected to the same source line and the same bit line, but have independent and separate floating gates. When programming the non-volatile memory device 100, electrons or charges are injected respectively and simultaneously into the floating gate 160a of the unit cell 101 and the floating gate 160b of the unit cell 102. Even electron/charge loss occurs on either one of the two unit cells 101 and 102 due to long operation time, the other one can still keep the stored data, and eventually, the non-volatile memory device 100 can provide correct data. In this way, the data correctness is improved. The single layer of polysilicon structure of the non-volatile memory device 100 is fully compatible with logic processes.

The present invention dual cell per bit type memory is composed of two parallel-connected unit cells having completely the same mirror structure. The two unit cells are programmed concurrently but the electrons/charge are stored in respective floating gates of the unit cells 101 and 102. In this way, the reliability is improved. In another embodiment, three or more such mirror unit cells can be combined to achieve higher level of data correctness depending upon customer's requirements or budget.

However, when programming the dual-unit cell non-volatile memory device 100 depicted in FIG. 2, a bit line voltage is applied to the bit line 220, and the two unit cells 101 and 102 are written simultaneously because the P+ drain doped regions 190a and 190b of the non-volatile memory device 100 are connect to the same bit line 220 through contact plugs 124a and 124b respectively. Therefore, such architecture consumes relatively higher writing current and larger charge pump area, thus difficulty in circuit design will increase and larger chip area is occupied.

Figure 3:
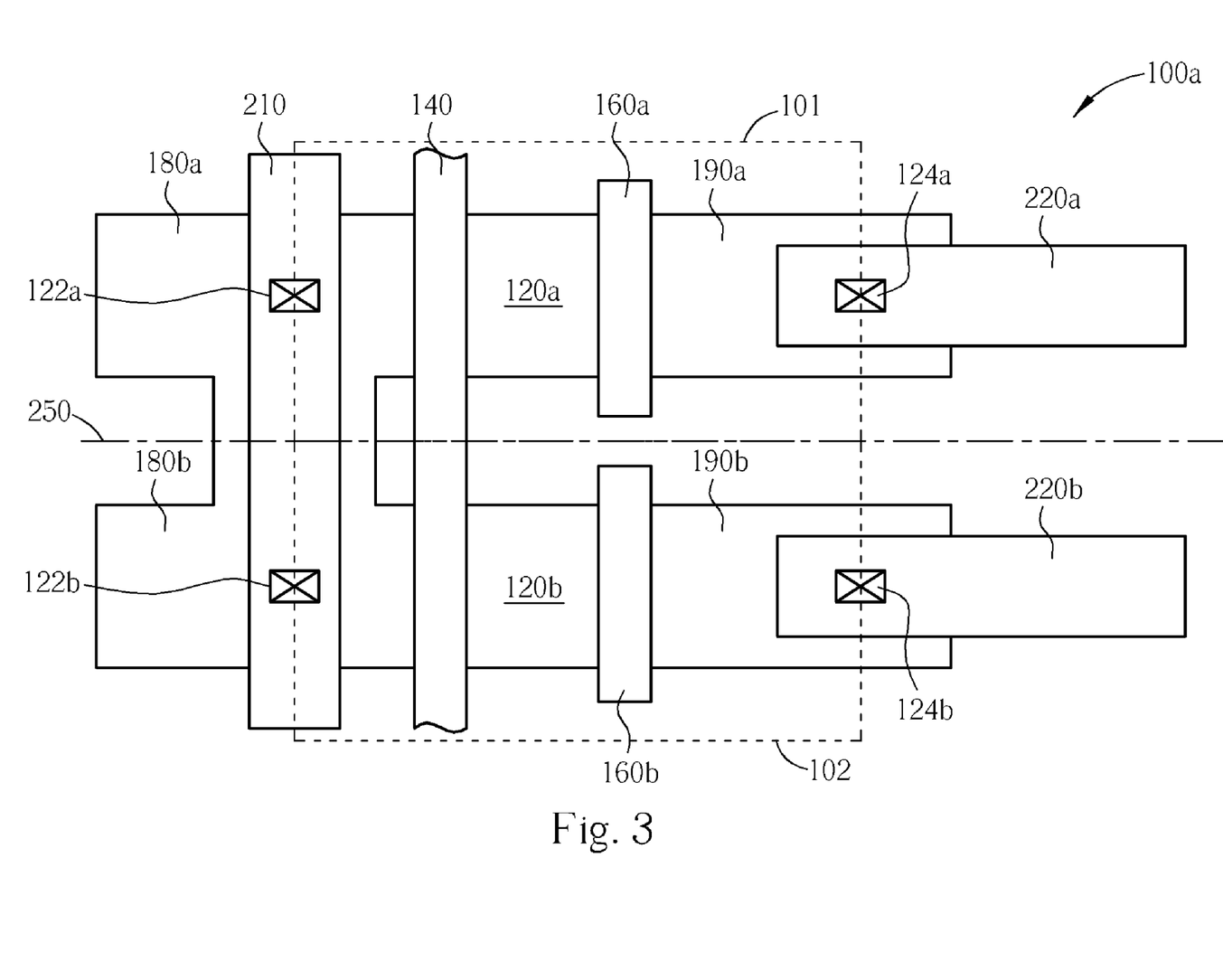
FIG. 3 is a schematic layout of a non-volatile memory cell according to the second preferred embodiment of the present invention.

FIG. 3 is a schematic layout of a non-volatile memory cell 100a according to the second embodiment of present invention. As shown in FIG. 3, likewise, the non-volatile memory device 100a comprises two unit cells 101 and 102, wherein the unit cells 101 and 102 are symmetric mirror images to each other in relative to the symmetric line 250.

The unit cell 101 comprises a select gate 140 used mutually with the unit cell 102, a P+ source doped region 180a and a P+ drain/source doped region 120a. The select gate 140, the P+ source doped region 180a and the P+ drain/source doped region 120a constitute a first select transistor of the non-volatile memory device 100. The unit cell 101 further comprises a first floating gate transistor serially connected with the first select transistor, and the first floating gate transistor comprises a floating gate 160a, the P+ drain/source doped region 120a and a P+ drain doped region 190a, wherein the first select transistor and the first floating gate transistor mutually use the P+ drain/source doped region 120a.

The unit cell 102 comprises the select gate 140 extending from the unit cell 101, a P+ source doped region 180b and a P+ drain/source doped region 120b. The select gate 140 extending from the unit cell 101, the P+ source doped region 180b and the P+ drain/source doped region 120b constitute a second select transistor of the non-volatile memory device 100. The unit cell 102 further comprises a second floating gate transistor serially connected to the second select transistor. The second floating gate transistor comprises a floating gate 160b, the P+ drain/source doped region 120b and a P+ drain doped region 190b, wherein the second select transistor and the second floating gate transistor use the P+ drain/source doped region 120b.

According to the second preferred embodiment of the present invention, the P+ source doped regions 180a and 180b of the non-volatile memory device 100 are connected to the same source line 210 through contact plugs 122a and 122b respectively. The source line 210 provides a source line voltage $V_{SL}$. The P+ drain doped regions 190a and 190b of the non-volatile memory device 100 are connected to bit lines 220a and 220b through contact plugs 124a and 124b respectively. The bit lines 220a and 220b provide bit line voltages $V_{BL1}$ and $V_{BL2}$ to unit cells 101 and 102 respectively. The P+ drain/source doped region 120a, the P+ drain/source doped region 120b, and the floating gates 160a and 160b are floating.

The major feature of the non-volatile memory device 100a depicted in FIG. 3 is that the unit cells 101 and 102 are symmetric mirror images to each other in structure and are used for one-bit storage purpose. Therefore, the non-volatile memory device 100a is called dual-cell per bit type non-volatile memory. The unit cell 101 uses the select gate mutually with the unit cell 102. Besides, unit cells 101 and 102 are connected to the same source line, but are connected to different bit lines. When programming, unit cells 101 and 102 are written respectively. The programming time will be longer, but the consumed current for writing can be reduced. Thus, the complexity and occupied area for the internal charge pump circuitry area are reduced.

Figure 4:
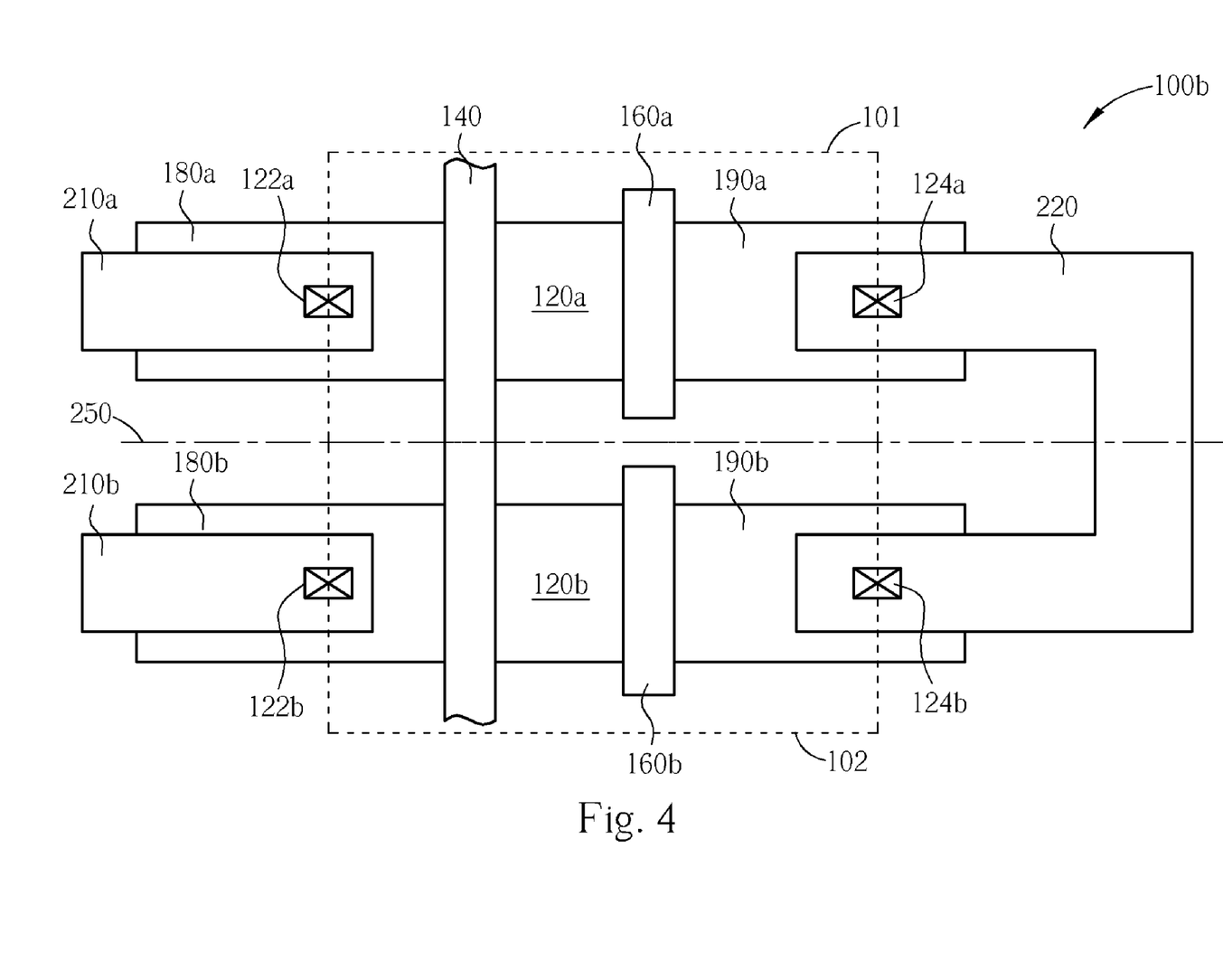
FIG. 4 is a schematic layout of a non-volatile memory cell according to the third preferred embodiment of the present invention.

FIG. 4 is a schematic layout of a non-volatile memory cell 100b according to the third preferred embodiment of the present invention. As shown in FIG. 4, the non-volatile memory device 100b comprises two unit cells 101 and 102, wherein the unit cells 101 and 102 are symmetric mirror images to each other in relative to the symmetric line 250.

The difference between the non-volatile memory device 100 in FIG. 2 and the non-volatile memory device 100b in FIG. 4 is that the P$^+$ source doped region 180a and 180b of the non-volatile memory device 100b are connected to the source lines 210a and 210b through contact plugs 122a and 122b respectively. The source lines 210a and 210b provide unit cells 101 and 102 with source line voltage $V_{SL1}$ and $V_{SL2}$, respectively.

When programming, unit cells 101 and 102 are written separately. The programming time will be relatively longer compared to the first preferred embodiment, but the consumed current for writing is reduced, thus the design for the internal charge pump circuitry area on the chip can be simplified and smaller charge pump area is required.

For example, when writing unit cell 101, a bit line voltage $V_{BL}$ is provided concurrently to the P$^+$ drain doped region 190a and 190b through the bit line 220, a select gate voltage $V_{SG}$ is provided to select gate 140, and a source line voltage $V_{SL1}$ is provided to the P$^+$ source doped region 180a through the source line 210a, wherein the source line 210b is floating or has the same voltage level as the bit line voltage $V_{BL}$. Under the aforesaid operating conditions, unit cell 101 is first programmed. Next, the unit cell 102 is programmed using reverse operating conditions.

Figure 5:
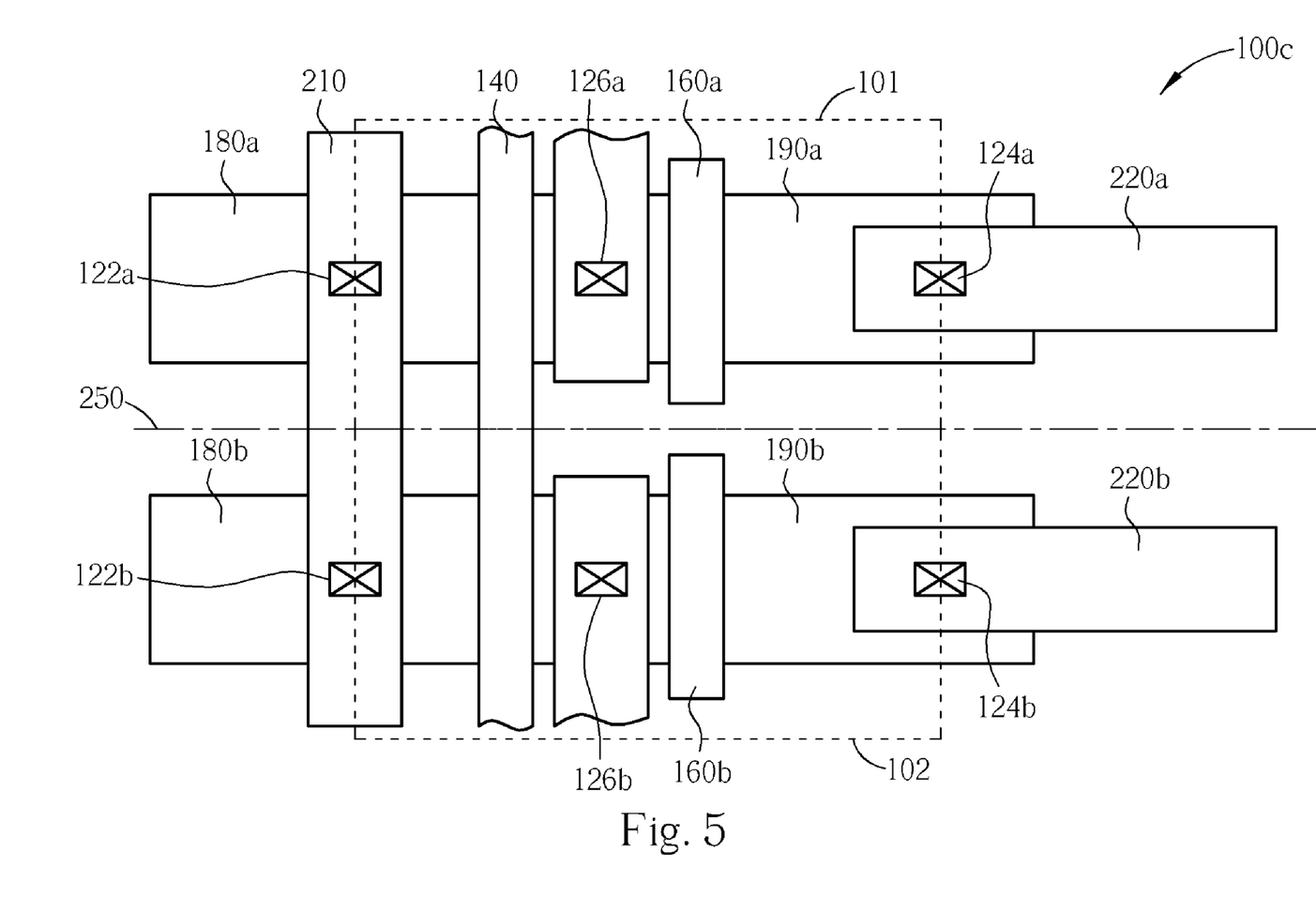
FIG. 5 is a schematic layout of a non-volatile memory cell according to the fourth preferred embodiment of the present invention.

FIG. 5 is a schematic layout of a non-volatile memory cell 100c according to the fourth preferred embodiment of the present invention. As shown in FIG. 5, the non-volatile memory cell 100c is a variant of the non-volatile memory cell 100a in FIG. 3. The non-volatile memory device 100c comprises two unit cells 101 and 102, wherein the unit cells 101 and 102 are symmetric mirror images to each other in relative to the symmetric line 250. The difference between the non-volatile memory device 100a in FIG. 3 and the non-volatile memory device 100c in FIG. 5 is that the P$^+$ drain/source doped regions 120a and 120b of the non-volatile memory device 100c are not floating, but connecting to voltage $IN_{1a}$ and $IN_{1b}$ through contact plugs 126a and 126b, respectively.

When programming, unit cells 101 and 102 are written separately. For example, when writing the unit cell 101, make the bit line 220b and the P$^+$ drain/source doped region 120b floating or to make the bit line 220b and the P$^+$ drain/source doped region 120b have the same voltage as the source line voltage $V_{SL}$, a source line voltage $V_{SL}$ is provided to the P$^+$ source doped regions 180a and 180b through the source line 210, a select gate voltage $V_{SG}$ is provided to the select gate 140, and a bit line voltage $V_{BL1}$ is provided to the P$^+$ drain doped region 190a through the bit line 220a, voltage $IN_{1a}$ is provided to the P$^+$ drain/source doped region 120a through the contact plug 126a. Under such operating conditions, the unit cell 101 is first programmed. The unit cell 102 is then programmed using reverse operating conditions.

Figure 6:
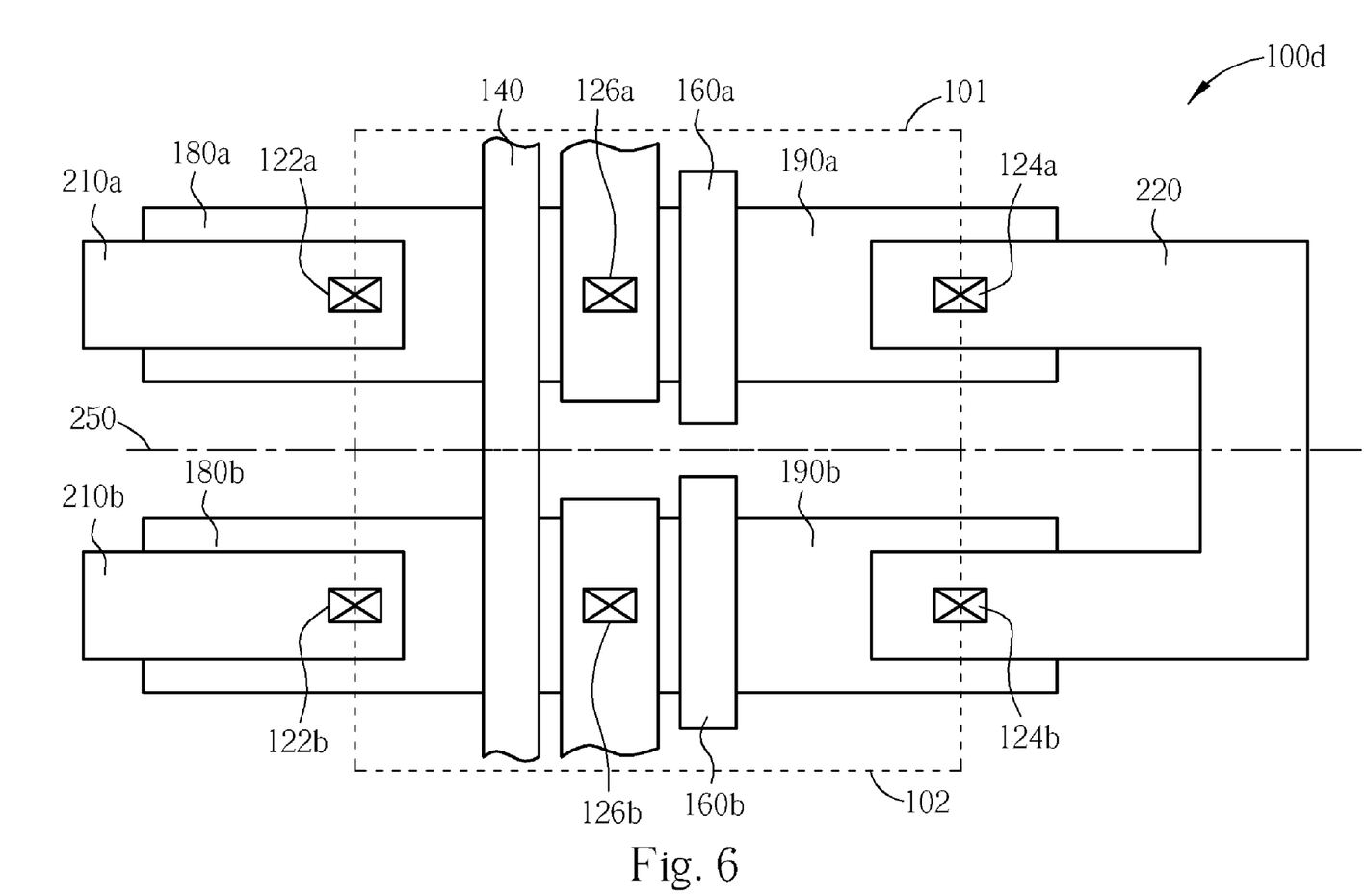
FIG. 6 is a schematic layout of a non-volatile memory cell according to the fifth preferred embodiment of the present invention.

FIG. 6 is a schematic layout of a non-volatile memory cell 100d according to the fifth preferred embodiment of the present invention. As shown in FIG. 6, the non-volatile memory cell 100d is a variant of the non-volatile memory cell 100b in FIG. 4. The non-volatile memory device 100d comprises two unit cells 101 and 102, wherein the unit cells 101 and 102 are symmetric mirror images to each other in relative to the symmetric line 250. The difference between the non-volatile memory device 100b in FIG. 4 and the non-volatile memory device 100d in FIG. 4 is that the P$^+$ drain/source doped regions 120a and 120b of the non-volatile memory device 100d are not floating, but connecting to a voltage $IN_{1a}$ and $IN_{1b}$ through contact plugs 126a and 126b, respectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile single-poly memory cell for one bit storage, comprising:
    a first unit cell comprising a select gate, a first P$^+$ source doped region and a first P$^+$ drain/source doped region, wherein the select gate, the first P$^+$ source doped region and the first P$^+$ drain/source doped region constitute a first select transistor; the first unit cell further comprising: a first floating gate transistor series connecting with the first select transistor in a first row, and the first floating gate transistor comprising a first floating gate, the first P$^+$ drain/source doped region and a first P$^+$ drain doped region, wherein the first select transistor uses the first P$^+$ drain/source doped region mutually with the first floating gate transistor; and
    a second unit cell parallel connected to the first unit cell, the second unit cell comprising a second select transistor consisting of the select gate extending from the first unit cell, a second P$^+$ source doped region and a second P$^+$ drain/source doped region; the second unit cell further comprising a second floating gate transistor series connecting with the second select transistor in a second row, and the second floating gate transistor comprising a second floating gate arranged in the same column as the first floating gate, the second P$^+$ drain/source doped region and a second P$^+$ drain doped region, wherein the second select transistor uses the second P$^+$ drain/source doped region mutually with the second floating gate transistor;
    wherein both the first P$^+$ drain doped region and the second P$^+$ drain doped region are connected to the same bit line.

2. The non-volatile single-poly memory cell for one bit storage of claim 1, wherein the non-volatile single-poly memory device further comprises a virtual symmetric line, the first unit cell and the second unit cell being symmetric mirror image to each other in relative to the virtual symmetric line.

3. The non-volatile single-poly memory cell for one bit storage of claim 1, wherein each of the select gate, the first floating gate and the second floating gate is composed of a single layer of polysilicon.

4. The non-volatile single-poly memory cell for one bit storage of claim 1, wherein both the first P$^+$ source doped region and the second P$^+$ source doped region are connected to the same source line.

5. The non-volatile single-poly memory cell for one bit storage of claim 1, wherein the first P$^+$ source doped region is connected to a first source line and the second P$^+$ source doped region is connected to a second source line, respectively.

6. The non-volatile single-poly memory cell for one bit storage of claim 1, wherein the first P$^+$ drain/source doped region and the second P$^+$ drain/source doped region are floating.

7. The non-volatile single-poly memory cell for one bit storage of claim 1, the first P$^+$ drain/source doped region is connected to a first voltage signal and the second P$^+$ drain/source doped region is connected to a second voltage signal, respectively.

* * * * *